United States Patent [19]

Underhill et al.

[11] 4,410,855
[45] Oct. 18, 1983

[54] ELECTRONIC ANALOG SWITCHING DEVICE

[75] Inventors: Michael J. Underhill, Horsham, England; Nicolaas J. M. Molle, Nijmegen, Netherlands

[73] Assignee: U.S. Philips Corporation, New York, N.Y.

[21] Appl. No.: 297,666

[22] Filed: Aug. 31, 1981

[30] Foreign Application Priority Data

Sep. 5, 1980 [GB] United Kingdom ............... 8028731

[51] Int. Cl.³ ................ H03K 17/16; H03K 17/687; G11C 27/02
[52] U.S. Cl. ................................. 328/151; 307/239; 307/353; 307/582
[58] Field of Search ............. 307/352, 353, 571, 582, 307/239; 328/151

[56] References Cited

U.S. PATENT DOCUMENTS

| | | | |
|---|---|---|---|
| 3,700,998 | 10/1972 | Lee et al. ............................. | 307/353 |
| 4,199,697 | 4/1980 | Edwards ............................. | 307/352 |
| 4,352,070 | 9/1982 | Beauducel et al. ................. | 307/353 |

Primary Examiner—John Zazworsky
Attorney, Agent, or Firm—Thomas A. Briody; William J. Streeter; Edward W. Goodman

[57] ABSTRACT

An electronic analog switching device comprises a differential operational amplifier (1) with a feedback circuit between its output (2) and its inverting (−) input such that its (low impedance) output voltage follows the input signal voltage applied to its non-inverting (+) input. The output voltage is sampled by a first switch (5) and the samples are passed to the device output (4) where, for example, they may be stored on a capacitor (7). The feedback circuit has two paths, one via a feedback impedance (9) and the other via the first switch (5) and a second switch (8) operated synchronously with the first switch by control means (6). The "on" impedance of the first switch (5) is greatly reduced by including it in the feedback circuit, and the further inclusion of the second switch (8) and the impedance (9) substantially eliminates unwanted transient voltages that would otherwise occur under some circumstances when the first switch operates.

2 Claims, 5 Drawing Figures

ELECTRONIC ANALOG SWITCHING DEVICE

BACKGROUND OF THE INVENTION

This invention relates to an electronic analog switching device, comprising an input terminal, an output terminal, a differential voltage amplifier having an inverting input, a non-inverting input and an output, a first on-off switch connected between the amplifier output and the output terminal, a feedback circuit from the output of the amplifier to its inverting input, and control means for controlling the on and off states of the first switch, the input terminal being connected to the non-inverting input of the amplifier.

Such a device is well known and is used, for example, as the analog switch of a sample-and-hold circuit in which an analog voltage signal is sampled at regular instants and the sampled voltage at each instant is stored, between successive instants, on a capacitor connected to the output terminal of the device. The impedance presented to the voltage signal by the sample-and-hold circuit must, of course, be high relative to that of the signal source and must also be constant. On the other hand, the impedance of the source which feeds the voltage sample to the storage capacitor must be as low as possible in order to achieve a very rapid charging of the capacitor. For these reasons, the signal voltage source is permanently connected to an operational amplifier, that is to say a high gain stable d.c. amplifier which has a high input impedance and a low output impedance, and the amplifier output is switched at the sampling instants to the capacitor. In order that the sampled voltage, sampled by the switch, is the same as that from the signal source at that instant, the gain of the operational amplifier is made unity by using a differential amplifier, having an inverting and a non-inverting input, with a feedback path from its output to its inverting input, the input signal being fed to its non-inverting input.

In the known analog switching device of the type described above, not only must the amplifier have a low output impedance but also the switch must have a very low "on" state impedance in order to minimize the effect of any output load (such as the capacitor in the above-mentioned sample-and-hold circuit) on the operation of the device. In a sample-and-hold circuit, the capacitor is normally followed by a further high impedance buffer amplifier and it is important to minimize leakage in the switching device; for example to minimize any discharge of the capacitor between sampling instants. The effect of leakage can be reduced by using a large capacitance value but then, for a given charging time for the capacitor, the series impedance of the switch in the "on" state (its "on" impedance) and the output impedance of the operational amplifier must be made proportionally lower. In integrated circuit form, this would mean that the area taken up by the switch and the amplifier would have to be relatively large which is a considerable disadvantage not only in size but also in cost. Further, the increase in area of the switch results in greater leakage and, hence, in reduced circuit performance.

It is also possible for an unwanted voltage transient to be generated the instant the switch is turned on. Also, in some circumstances, there may in practice by cross-talk, or cross-coupling, between the two inputs (inverting and non-inverting) of the operational amplifier.

The circumstances which lead, or may lead, to the above-mentioned disadvantages are explained below in more detail.

SUMMARY OF THE INVENTION

The object of the invention is at least to mitigate these disadvantages.

The invention accordingly provides an electronic analog switching device, comprising an input terminal, an output terminal, a differential voltage amplifier having an inverting input, a non-inverting input and an output, a first on-off switch connected between the amplifier output and the output terminal, a feedback circuit from the output of the amplifier to its inverting input, and control means for controlling the on and off states of the first switch, the input terminal being connected to the non-inverting input of the amplifier; characterized in that the feedback circuit comprises a first feedback path connected directly between the amplifier output and its inverting input and a second feedback path comprising a second on-off switch connected directly between the inverting input and the output terminal, which second switch is controllable by the control means such that it is switched on and off synchronously and in phase with the first switch, and wherein the first feedback path has an impedance which, in the "on" state of the two switches, is high relative to the combined "on" impedances of the two switches and which, in the "off" state of the two switches, is low relative to the "off" impedance of the second switch and also to the input impedance of the inverting input of the amplifier.

The first feedback path may comprise a single resistor having a fixed value. This means that the selected value for the resistance is a compromise with respect to the values of the various other impedances concerned.

The need for such a compromise can be eliminated by varying the impedance of the first feedback path in dependence upon whether the first and second switches are both in the "on" or the "off" state. Accordingly, the first feedback path may alternatively comprise a third on-off switch controllable by the control means such that it is on when the other two switches are off and vice versa. In this way, the impedance of the first feedback path is switched from one value to another simultaneously with each change of state of the first and second switches.

DESCRIPTION OF THE DRAWING

The various features and advantages of the invention will become evident from the following discussion of a known prior art circuit and the following description of embodiments of the invention, each with reference to the accompanying drawings, of which.

DESCRIPTION OF THE PREFERRED EMBODIMENTS

Figure 1:
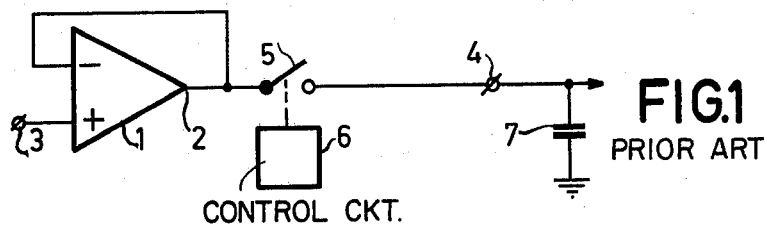
FIG. 1 is a schematic circuit diagram of the known prior art discussed above.

The known circuit of an electronic analog switching device shown in FIG. 1 comprises a differential operational amplifier 1 having an inverting (−) input, a non-inverting (+) input, and an output 2. An input terminal 3 of the device is connected to the non-inverting input of amplifier 1 and the output 2 is connected directly to the inverting input by a feedback circuit. Output 2 is also connected to an output terminal 4 of the device via an on-off switch 5, the instantaneous state of which is controlled by control means 6.

The circuit shown in FIG. 1 further shows a load capacitor 7 connected to the output terminal 4 of the device such that the complete circuit constitutes a sample-and-hold circuit.

As is well known, differential voltage amplifiers of the so-called operational amplifier type have a very high input impedance for each of their two inputs (+ and −) and a low output impedance. The connection of the output 2 of such an amplifier to its inverting (−) input by a feedback circuit causes the gain of the amplifier to be unity. As a result, the output voltage of the amplifier has the same instantaneous value as the input voltage, i.e. it is a unity gain follower circuit.

In operation of the arrangement shown in FIG. 1, the voltage at output 2, which is the same as that at input 2, is switched to output terminal 4 by the operation of switch 5 by control means 6 at instants determined by the latter. The duration of the operation of switch 5 to its "on" state is sufficient to allow capacitor 7 to charge up to a value representative of the sampled voltage. The time taken to charge capacitor 7 substantially depends upon the capacitance value times the sum of the "on" impedance of switch 5 plus the output impedance of amplifier 1. Therefore these two impedances have to be very low in order to allow the signal voltage to be sampled and stored rapidly. When switch 5 is set to its "off" state by control means 6, capacitor 7 should hold the sampled voltage substantially constant—generally until the next operation of switch 5—and hence the leakage across the capacitor must be minimal. Thus switch 5 must have a very large leakage impedance in the "off" state. The switch 5 is a transistor in most modern applications and the low leakage requirement calls for a small area transistor. However, this conflicts with the very low "on" impedance of the transistor—which calls for a large area.

Figure 2:
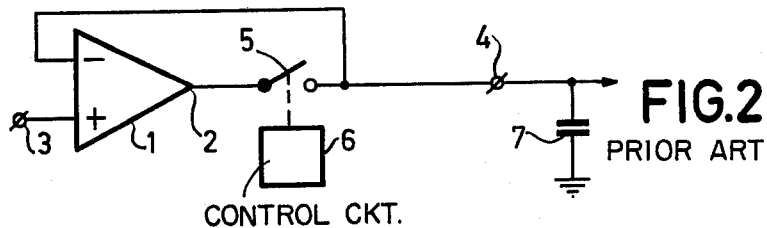
FIG. 2 shows an improved version of the circuit shown in FIG. 1.

FIG. 2 shows a possible improvement to the circuit shown in FIG. 1, the only difference being that the feedback path now includes switch 5, thereby reducing the "on" impedance by the feedback gain of the amplifier. Thus a much smaller transistor can be used for switch 5 for the same charging time constant of capacitor 7 and the use of a smaller transistor reduces the leakage.

However, if too large a step change occurs in the input signal voltage, the amplifier will temporarily saturate and this will limit the rate at which the capacitor voltage can follow the input voltage with the switch 5 in its on state. With the switch 5 in its off state the voltage at output 2 of the amplifier is likely to saturate—either in a positive or a negative sense—if there is a small change in the input signal voltage because the amplifier feedback path (which limits its gain to unity) is disconnected. This means that, at the instant switch 5 is again switched on, there will be a large instantaneous voltage difference between the voltage at terminal 3 and the voltage at output 2. This will cause an unwanted transient change in the voltage at terminal 4. A further practical disadvantage is that there may be cross-talk or cross-coupling in the amplifier input stages between the two inputs thereto.

Figure 3:
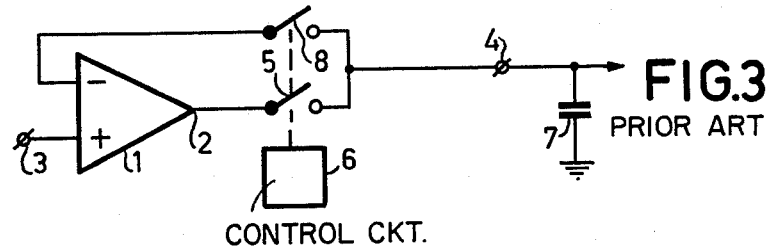
FIG. 3 shows an improved version of the circuit shown in FIG. 2.

This latter problem may be solved by the circuit shown in FIG. 3, in which a second switch 8 is included in the amplifier feedback path. Switch 8 is operated by control means 6 in synchronism with switch 5 such that they both turn on and off together—i.e. they operate in phase. This solves the cross-talk problem without effecting the performance in the "on" state of the two switches. However the feedback circuit is again disconnected and, therefore, the transient voltage problem still remains.

Figure 4:
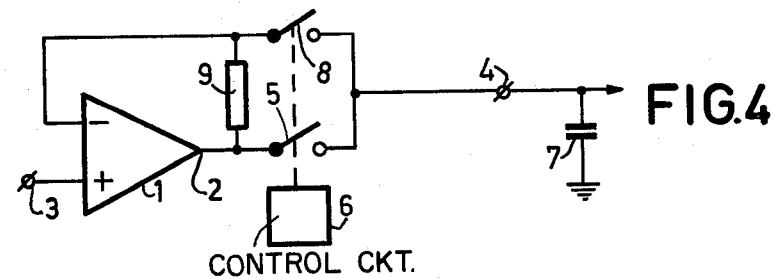
FIG. 4 shows a first embodiment of a device according to the invention.

All the above-mentioned disadvantages are at least very substantially mitigated by a device according to the invention, a first embodiment of which is shown in FIG. 4. The feedback circuit for amplifier 1 now comprises two feedback paths, namely a first path comprising a resistor 9 and a second path comprising the two switches 5 and 8. Since the feedback for amplifier 1 is maintained by resistor 9 when the two switches 5 and 8 are off, the transient voltages referred to above cannot occur.

The resistance value of resistor 9 should be low compared with the input impedance of the inverting input of amplifier 1 such that the resistor has a negligible effect on the level of the feedback signal when switches 5 and 8 are off. It should also have a low value relative to the "off" impedance of at least the second switch 8. The reason for this is that, if it is assumed that the switch 8 has a finite "on" impedance, then there will be feedback to the inverting input of amplifier 1 of a proportion of any voltage existing on the load—e.g. the voltage stored on capacitor 7. This unwanted feedback is rendered negligible compared with the wanted feedback voltage from output 2 of amplifier 1, with switches 5 and 8 in the "off" state, by making the value of resistor 9 low compared with the "off" impedance is switch 8.

The resistance value of resistor 9 should further be high relative to the combined "on" resistances of switches 5 and 8 in order that the feedback applied to the amplifier in the "on" state of the switches is effected substantially entirely via the switches. This is necessary to ensure that the "on" impedance of switch 5 is effectively reduced by a factor equal to the feedback gain.

In order to achieve very high amplifier input impedances, field effect transistors are usually used for the amplifier circuit, in which case the input impedances are typically of the range $10^8$ to $10^9$ ohms. Similarly, if such transistors are used for switches 5 and 8, their "off" impedances would typically be in the same range. In a practical embodiment in integrated circuit form, the dynamic "on" impedances of switches 5 and 8 are about 5000 ohms. Thus the optimum resistance value for resistor 9 would be approximately halfway between 5000 and $10^8$ ohms, for example in the range $10^5$ to $10^6$ ohms.

Figure 5:
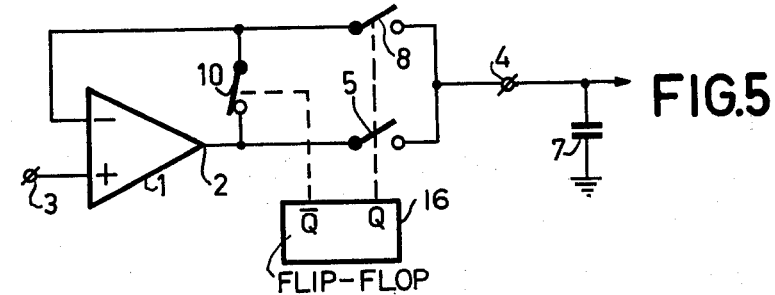
FIG. 5 shows a second embodiment of a device according to the invention.

An improved embodiment of the device according to the invention is shown in FIG. 5 in which the resistor 9 of FIG. 4 is replaced by an impedance in the form of a third switch 10. Switch 10 is operated by the control means 16 such that it is in the "on" state whenever the switches 5 and 8 are in the "off" state and vice versa.

The control means 6 in FIGS. 1 to 4 may, for example, be a clock pulse generator which generates pulses of the required sampling period width and having an amplitude equal to the full supply voltage—for example 10 volts. Such pulses may for example be obtained from the Q output of a multivibrator or of a flip-flop driven by clock pulses. The control circuit 16 of FIG. 5 may similarly have a Q pulse output and, in the event, that control pulses for switch 10 would be taken from the $\overline{Q}$ output. Alternatively the control pulses applied to switches 5 and 8 may be fed to switch 10 via an inverting gate.

Thus the impedance of switch 10 has one value when switches 5 and 8 are "on" and a different value when they are "off." If switch 10 is generally similar to switches 5 and 8 described above, then its "on" impedance (5000 ohms) is very substantially lower than the impedance of the amplifier inverting input and the "off" impedance of switch 8 ($10^8$ ohms in each case) and its "off" impedance ($10^8$ ohms) is very substantially greater than the combined "on" impedances (5000 ohms) of switches 5 and 8.

We claim:

1. An electronic analog switching device, comprising an input terminal, an output terminal, a differential voltage amplifier having an inverting input, a non-inverting input and an output, a first on-off switch connected between the amplifier output and the output terminal, a feedback circuit from the output of the amplifier to its inverting input, and control means for controlling the "on" and "off" states of the first switch, the input terminal being connected to the non-inverting input of the amplifier; characterized in that the feedback circuit comprises a first feedback path connected directly between the amplifier output and its inverting input and a second feedback path comprising a second on-off switch connected directly between the inverting input and the output terminal, said first feedback path comprising a third on-off switch, in which said second and third switches are controllable by the control means such that all three switches are switched "on" and "off" synchronously, said second switch in phase with the first switch and said third switch in antiphase with said first and second switches, wherein the third switch presents an "off" impedance in the first feedback path which is high relative to the combined "on" impedance of the first and second switches and which third switch presents an "on" impedance which is low relative to the "off" impedance of the first and second switches and also to the input impedance of the inverting input of the amplifier.

2. A sample-and-hold circuit comprising an electronic analog switching device as claimed in claim 1 and a storage capacitor connected to the output terminal of said device.

* * * * *